(12) United States Patent
Zhang et al.

(10) Patent No.: US 12,707,736 B2
(45) Date of Patent: Aug. 11, 2026

(54) DETECTOR SUBSTRATE AND FLAT PANEL DETECTOR

(71) Applicants: Beijing BOE Sensor Technology Co., Ltd., Beijing (CN); BOE TECHNOLOGY GROUP CO., LTD., Beijing (CN)

(72) Inventors: Guan Zhang, Beijing (CN); Jin Cheng, Beijing (CN); Zhenwu Jiang, Beijing (CN); Zhenyu Wang, Beijing (CN); Yifan Yang, Beijing (CN)

(73) Assignees: Beijing BOE Sensor Technology Co., Ltd., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 399 days.

(21) Appl. No.: 18/578,372

(22) PCT Filed: Jul. 15, 2022

(86) PCT No.: PCT/CN2022/105957
§ 371 (c)(1),
(2) Date: Jan. 11, 2024

(87) PCT Pub. No.: WO2024/011584
PCT Pub. Date: Jan. 18, 2024

(65) Prior Publication Data

US 2025/0113632 A1 Apr. 3, 2025

(51) Int. Cl.
*H10F 39/00* (2025.01)
*G01T 1/24* (2006.01)
*H10F 39/18* (2025.01)

(52) U.S. Cl.
CPC .......... *H10F 39/8033* (2025.01); *G01T 1/24* (2013.01); *H10F 39/1898* (2025.01); *H10F 39/80377* (2025.01)

(58) Field of Classification Search
CPC ........................................................ G01T 1/24
See application file for complete search history.

(56) References Cited

U.S. PATENT DOCUMENTS

2008/0272320 A1* 11/2008 Imai ........................ G01T 1/244 250/580
2009/0238330 A1* 9/2009 Luhta ........................ G01T 1/24 378/19

(Continued)

FOREIGN PATENT DOCUMENTS

CN 107768390 A 3/2018
CN 110945659 A 3/2020

(Continued)

*Primary Examiner* — Blake C Riddick
(74) *Attorney, Agent, or Firm* — HOUTTEMAN LAW LLC

(57) ABSTRACT

The present disclosure provides a detector substrate and a flat panel detector, the detector substrate includes a substrate base and detector pixel units on the substrate base, each detector pixel unit includes: a driver circuit; a photoelectric conversion device disposed on a side, away from the substrate base, of the driver circuit, the photoelectric conversion device including at least two photoelectric conversion structures connected in series, a bottom electrode of a first photoelectric conversion structure being electrically connected with the driver circuit, and a top electrode of an $n^{th}$ photoelectric conversion structure being electrically connected with a bottom electrode of an $(n+1)^{th}$ photoelectric conversion structure, with n being greater than or equal to 1; and a bias voltage line on a side of the photoelectric conversion device away from the substrate base, the bias voltage line being electrically connected to a top electrode of a last photoelectric conversion structure.

20 Claims, 5 Drawing Sheets

(56) References Cited

U.S. PATENT DOCUMENTS

2012/0068078 A1* 3/2012 Zhang ................... H10F 39/026 250/371
2013/0032723 A1* 2/2013 Lee ......................... G21K 4/00 250/369
2013/0092845 A1* 4/2013 Mollov ..................... G01T 1/24 250/394
2015/0063544 A1* 3/2015 Kim ......................... H05G 1/30 378/91
2016/0161426 A1* 6/2016 Wober ...................... G01T 1/24 378/19
2016/0327656 A1* 11/2016 Kim ...................... G01T 1/1603
2016/0359112 A1* 12/2016 Wang ................... H10K 59/122
2017/0018588 A1* 1/2017 Karim ..................... H10F 30/29
2018/0078766 A1 3/2018 Matolin et al.
2018/0240826 A1 8/2018 Park et al.
2018/0277608 A1* 9/2018 Lifka ........................ G01T 1/24
2019/0123110 A1* 4/2019 Fischer ................... G01T 1/241
2020/0018864 A1* 1/2020 Lee ......................... H10F 30/29
2020/0025954 A1* 1/2020 Lee ......................... G01T 1/247
2020/0127040 A1* 4/2020 D'Sant Angelo ..... H10F 71/128
2020/0350374 A1* 11/2020 Yuan .................. H10K 59/1201
2021/0066382 A1 3/2021 Harmon
2021/0135020 A1* 5/2021 Zhao ..................... H10F 77/148
2021/0202779 A1* 7/2021 Hou ........................ H10F 30/29
2021/0223413 A1* 7/2021 Gu ...................... G01T 1/20181
2023/0161057 A1* 5/2023 Kelly ................... C09D 11/033 250/370.12

FOREIGN PATENT DOCUMENTS

CN 112133717 A 12/2020
CN 114388538 A 4/2022
JP S61115355 A 6/1986
JP 2009222478 A 10/2009
JP 2013210277 A 10/2013

* cited by examiner

DETECTOR SUBSTRATE AND FLAT PANEL DETECTOR

TECHNICAL FIELD

The present disclosure relates to the field of photoelectric detection technologies, and in particular, relates to a detector substrate and a flat panel detector.

BACKGROUND

A flat panel X-ray detector (FPXD) manufactured based on a thin film transistor (TFT) technology is a vital element in a digital imaging technology, and is widely applied to the fields of medical imaging (such as chest X-ray), industrial detection (such as metal flaw detection), security detection, air transportation and the like due to the advantages of fast imaging speed, good spatial and density resolution, high signal-to-noise ratio, direct digital output and the like.

The flat panel X-ray detector mainly includes a thin film transistor and a photoelectric conversion device. Under an irradiation of X rays, a scintillator layer or a phosphor layer of the flat panel X-ray detector in an indirect conversion type converts X-ray photons into visible light, then the visible light is converted into an electrical signal through the photoelectric conversion device, and finally the electric signal is read out through the thin film transistor and is output to display an image.

SUMMARY

Embodiments of the present disclosure provides a detector substrate and a flat panel detector as follows.

An embodiment of the present disclosure provides a detector substrate, which includes a substrate base and a plurality of detector pixel units disposed on the substrate base, each of the detector pixel units includes: a driver circuit disposed on the substrate base; a photoelectric conversion device disposed on a side, away from the substrate base, of the driver circuit, the photoelectric conversion device including at least two photoelectric conversion structures sequentially connected in series, a bottom electrode of a first photoelectric conversion structure in the at least two photoelectric conversion structures being electrically connected with the driver circuit, and a top electrode of an $n^{th}$ photoelectric conversion structure being electrically connected with a bottom electrode of an $(n+1)^{th}$ photoelectric conversion structure, with n being greater than or equal to 1; and a bias voltage line disposed on a side of the photoelectric conversion device away from the substrate base, the bias voltage line being electrically connected to a top electrode of the last photoelectric conversion structure of the at least two photoelectric conversion structures.

In some implementations, in the detector substrate provided in the embodiment of the present disclosure, orthographic projections of the photoelectric conversion structures on the substrate base do not overlap each other.

In some implementations, in the detector substrate provided in the embodiment of the present disclosure, bottom electrodes of the photoelectric conversion structures are disposed in a same layer, and top electrodes of the photoelectric conversion structures are disposed in a same layer.

In some implementations, in the detector substrate provided in the embodiment of the present disclosure, an orthographic projection of the first photoelectric conversion structure on the substrate base covers an orthographic projection of the driver circuit on the substrate base.

In some implementations, the detector substrate provided in the embodiment of the present disclosure further includes a conductive connection part for connecting the photoelectric conversion structures in series, and the conductive connection part and the bias voltage line are disposed in a same layer.

In some implementations, in the detector substrate provided in the embodiment of the present disclosure, a division line between any two adjacent photoelectric conversion structures intersects with the bias voltage line.

In some implementations, in the detector substrate provided in the embodiment of the present disclosure, the division line is parallel to a diagonal line of the detector pixel unit.

In some implementations, in the detector substrate provided in the embodiment of the present disclosure, the division line is perpendicular to the bias voltage line.

In some implementations, in the detector substrate provided in the embodiment of the present disclosure, a division line between any two adjacent photoelectric conversion structures is parallel to the bias voltage line.

In some implementations, in the detector substrate provided in the embodiment of the present disclosure, the photoelectric conversion device includes a first photoelectric conversion structure and a second photoelectric conversion structure connected in series, a bottom electrode of the first photoelectric conversion structure is electrically connected to the driver circuit, a top electrode of the first photoelectric conversion structure is electrically connected to an end of the conductive connection part, another end of the conductive connection part is electrically connected to a bottom electrode of the second photoelectric conversion structure, and a top electrode of the second photoelectric conversion structure is electrically connected to the bias voltage line.

In some implementations, in the detector substrate provided in the embodiment of the present disclosure, an area of the first photoelectric conversion structure is less than or equal to an area of the second photoelectric conversion structure.

In some implementations, the detector substrate provided in the embodiment of the present disclosure further includes a first planarization layer disposed between the photoelectric conversion device and the bias voltage line, the first planarization layer includes a first part covering the top electrode of the first photoelectric conversion structure, a second part covering the top electrode of the second photoelectric conversion structure, and a third part filled in a gap between the first photoelectric conversion structure and the second photoelectric conversion structure, a first end of the conductive connection part is electrically connected with the top electrode of the first photoelectric conversion structure through a first via penetrating through the first part, a second end of the conductive connection part is electrically connected with the bottom electrode of the second photoelectric conversion structure through a second via penetrating through the third part, and the bias voltage line is electrically connected to the top electrode of the second photoelectric conversion structure through a third via penetrating through the second part.

In some implementations, the detector substrate provided in the embodiment of the present disclosure further includes: a passivation layer between the driver circuit and the photoelectric conversion device, and a second planarization layer between the passivation layer and the photoelectric conversion device, the bottom electrode of the first photoelectric conversion structure is electrically connected with the driver circuit through a fourth via penetrating through the second planarization layer and the passivation layer.

In some implementations, in the detector substrate provided in the embodiment of the present disclosure, the first photoelectric conversion structure includes a first avoidance portion, the first avoidance portion is close to the driver circuit, and the second via and the fourth via are disposed in a region where the first avoidance portion is disposed.

In some implementations, in the detector substrate provided in the embodiment of the present disclosure, the second photoelectric conversion structure includes a second avoidance portion, the second avoidance portion is close to the driver circuit, and the second via and the fourth via are disposed in a region where the second avoidance portion is disposed.

In some implementations, in the detector substrate provided in the embodiment of the present disclosure, the first photoelectric conversion structure includes a first avoidance portion, the second photoelectric conversion structure includes a second avoidance portion, the first avoidance portion and the second avoidance portion are adjacent to each other to form an avoidance part, the avoidance part is close to the driver circuit, and the second via and the fourth via are disposed in a region where the avoidance part is disposed.

In some implementations, in the detector substrate provided in the embodiment of the present disclosure, an orthographic projection of the second via on the substrate base and an orthographic projection of the fourth via on the substrate base do not overlap.

In some implementations, in the detector substrate provided in the embodiment of the present disclosure, the second via and the fourth via are arranged along a direction in which the bias voltage line extends, or the second via and the fourth via are arranged along a direction perpendicular to the direction in which the bias voltage line extends.

In some implementations, in the detector substrate provided in the embodiment of the present disclosure, the first via and the second via are arranged along the direction in which the bias voltage line extends, or the first via and the second via are arranged along a direction perpendicular to the direction in which the bias voltage line extends.

In some implementations, in the detector substrate provided in the embodiment of the present disclosure, the photoelectric conversion structure includes a photoelectric conversion layer disposed between the top electrode and the bottom electrode, and a thickness of the photoelectric conversion layer ranges from about 0.9 μm to about 1.5 μm.

In some implementations, in the detector substrate provided in the embodiment of the present disclosure, the photoelectric conversion structure includes a photoelectric conversion layer disposed between the top electrode and the bottom electrode, and a thickness of the photoelectric conversion layer ranges from about 0.5 μm to about 0.7 μm.

In some implementations, the detector substrate provided in the embodiment of the present disclosure further includes: a protective layer disposed on a side, away from the substrate base, of the bias voltage line; and a scintillator layer disposed on a side, away from the substrate base, of the protective layer.

An embodiment of the present disclosure further provides a flat panel detector, which includes the detector substrate provided in the embodiment of the present disclosure.

DETAILED DESCRIPTION

Figure 1:
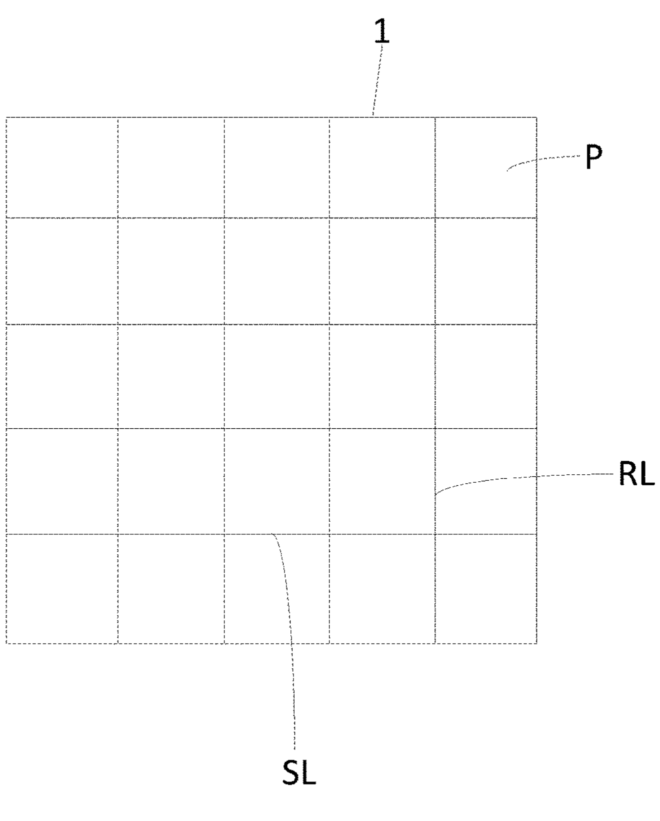
FIG. 1 is a schematic diagram of a detector substrate according to an embodiment of the present disclosure.

To make objects, technical solutions and advantages of embodiments of the present disclosure more apparent, the technical solutions of the embodiments of the present disclosure will be clearly and completely described below with reference to the drawings of the embodiments of the present disclosure. It is to be understood that the described embodiments are only a few embodiments of the present disclosure, but not all embodiments. The embodiments and features of the embodiments in the present disclosure may be combined with each other without conflict. All other embodiments, which can be derived by a person skilled in the art from the described embodiments of the present disclosure without any creative effort, are within the protection scope of the present disclosure.

Unless defined otherwise, technical or scientific terms used herein shall have the ordinary meaning as understood by one of ordinary skill in the art to which the present disclosure belongs. The use of "including/include" or "comprising/comprise" and the like in the present disclosure is intended to mean that the elements or items listed before that word, and equivalents thereof, are included without exclusion of other elements or items. The terms "connected" or "coupled" and the like are not restricted to physical or mechanical connections, but may include electrical connections, whether direct or indirect. Terms "inner/in/inside", "outer/out/outside", "upper/on/above", "lower/under/below", and the like are used merely to indicate relative positional relationships, and when the absolute position of the object being described is changed, the relative positional relationships may be changed accordingly.

It should be noted that sizes and shapes of various figures in the drawings are not to scale, but are merely intended to schematically illustrate the present disclosure. Moreover, like reference numerals refer to like or similar elements or elements having like or similar functions throughout.

Generally, a flat panel X-ray detector includes a plurality of detector pixel units, each detector pixel unit includes a thin film transistor (TFT) and a photoelectric conversion device (such as PIN diode), and an ideal structure of the detector pixel unit has a relatively high pixel fill-rate and a relatively low RC delay time, so as to obtain a relatively ideal sensitivity at a relatively high rate of reading frames. The R depends on an on-resistance (Ron) of the TFT, which is substantially difficult to be significantly reduced after a material of the TFT is determined, the C depends on a reverse bias capacitance of a PIN (positive-intrinsic-negative) junction of the PIN diode and is related to an area, a thickness and the like of the PIN structure, and the sensitivity of the detector is then directly proportional to the area of the PIN structure, i.e., the pixel fill-rate in the conventional sense. However, the greater the area of the PIN structure is, the greater the C is. In order to reduce the C without sacrificing the sensitivity, the PIN structure is often thickened to fabricate the device, which desires a prolonged time duration for depositing the hydrogenated (H Plasmas) amorphous-silicon PIN structure. For example, if the TFT adopts an IGZO (indium gallium zinc oxide) active layer, the TFT has excellent carrier mobility, a readout rate of detection data can be improved, and a dynamic real-time detection can be realized. However, the IGZO active layer under the PIN structure is very sensitive to hydrogen, so that the IGZO active layer is easily to be transformed to be conductive in a hydrogenation process, and the risk of a failure of a switching characteristic is greatly increased. Therefore, how to reduce the C of the pixel unit without significantly affecting the effective pixel fill-rate in a case where the thickness of the PIN structure is not to be changed or even properly thinned is a direction worthy of research and exploration.

Figure 2:
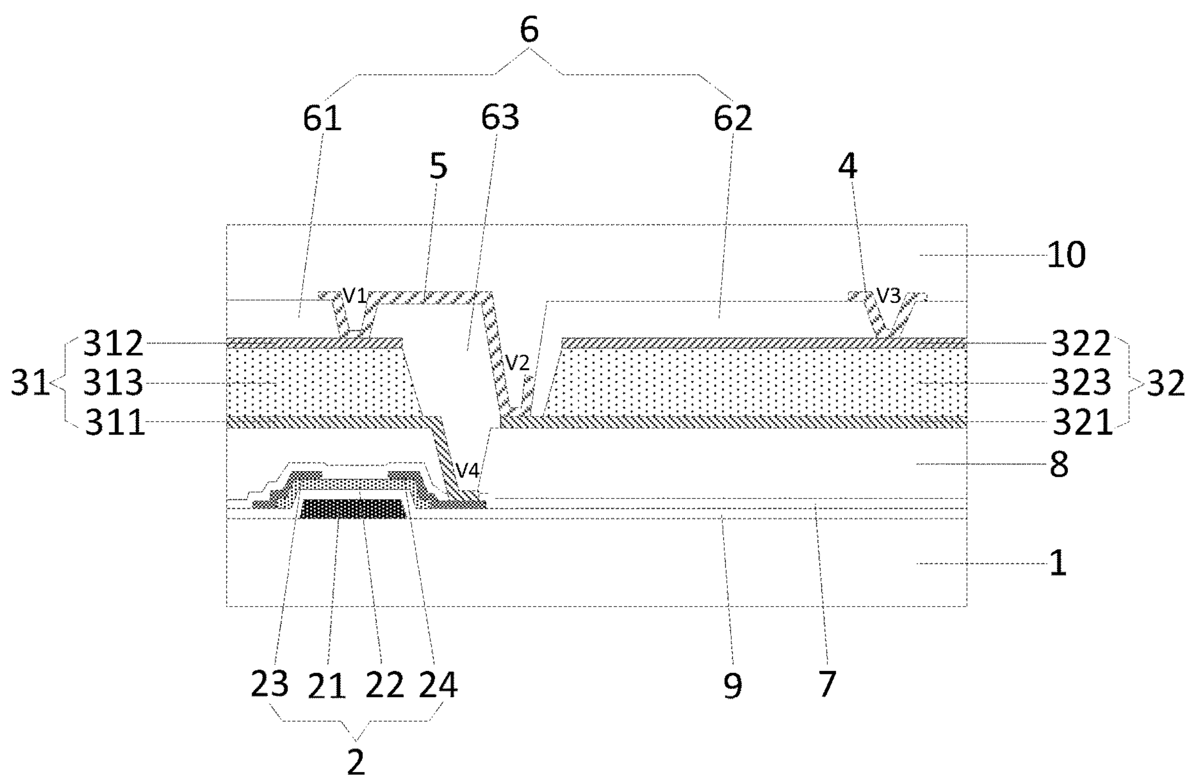
FIG. 2 is a schematic cross-sectional view of a detector pixel unit in the detector substrate shown in FIG. 1.
Figure 3:
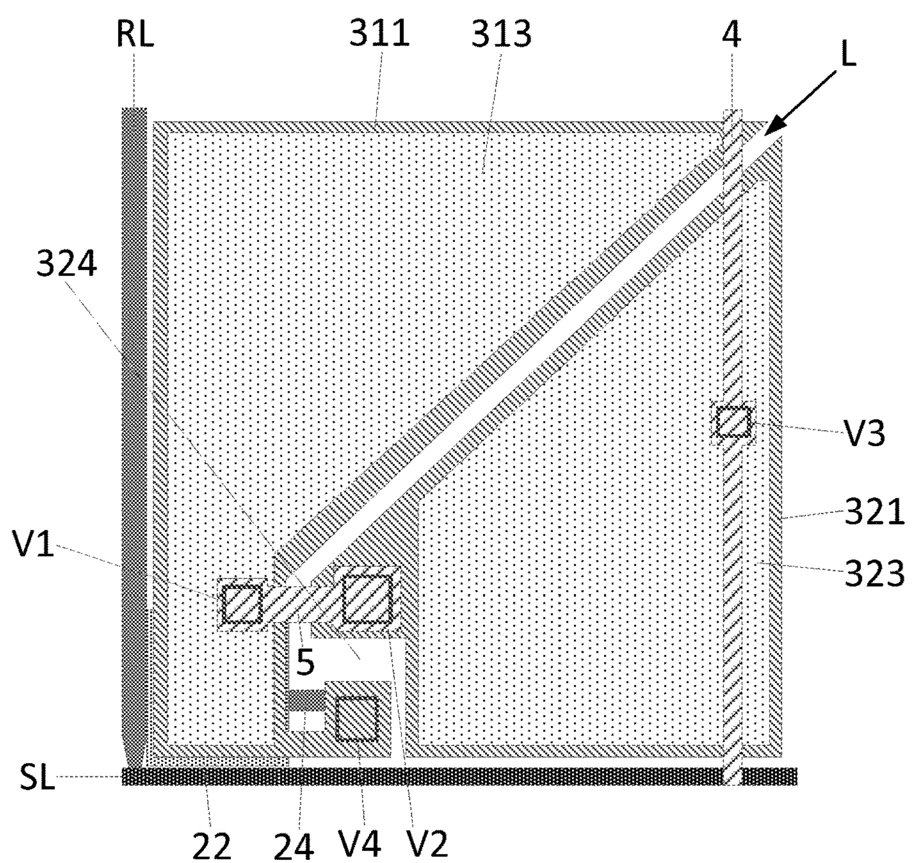
FIG. 3 is a schematic plan view of a detector substrate including the detector pixel unit shown in FIG. 2.
Figure 4:
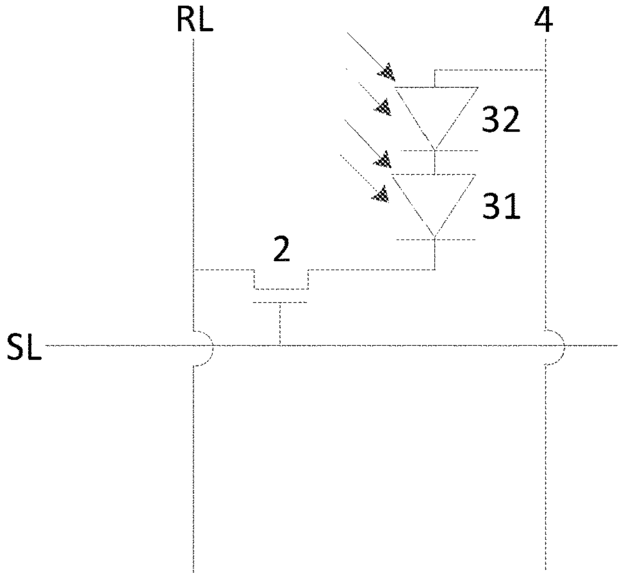
FIG. 4 is a schematic diagram of an equivalent circuit of the detector pixel unit shown in FIG. 2.

In view of above, an embodiment of the present disclosure provides a detector substrate, and as shown in FIG. 1, the detector substrate includes a substrate base 1 and a plurality of detector pixel units P disposed on the substrate base 1, the plurality of detector pixel units P are defined by a plurality of scan-signal lines SL and a plurality of read-signal lines RL, the scan-signal lines SL intersect with the read-signal lines RL. FIG. 2 is a schematic cross-sectional view of the detector pixel unit P in FIG. 1, FIG. 3 is a schematic plan view of part of film layers in FIG. 2, and FIG. 4 is a schematic diagram of an equivalent circuit of the detector pixel unit P in FIG. 2. As shown in FIGS. 2 to 5, each detector pixel unit P includes: a driver circuit 2 disposed on the substrate base 1; a photoelectric conversion device 3 disposed on a side of the driver circuit 2 away from the substrate base 1, the photoelectric conversion device 3 including at least two photoelectric conversion structures connected in series (e.g., including two photoelectric conversion structures 31 and 32 connected in series), a bottom electrode 311 of the first photoelectric conversion structure (e.g., 31) of the at least two photoelectric conversion structures (31 and 32) is electrically connected to the driver circuit 2, and a top electrode 312 of the $n^{th}$ photoelectric conversion structure (e.g., the first photoelectric conversion structure 31) is electrically connected to a bottom electrode 321 of the $(n+1)^{th}$ photoelectric conversion structure (e.g., the second photoelectric conversion structure 32), with n being greater than or equal to 1; a bias voltage line 4 disposed on a side of the photoelectric conversion device 3 away from the substrate base 1, the bias voltage line 4 being electrically connected to a top electrode 322 of the last photoelectric conversion structure (e.g., 32) of the at least two photoelectric conversion structures (31 and 32).

According to the detector substrate provided in the embodiment of the present disclosure, at least two photoelectric conversion structures sequentially connected in series are arranged in each detector pixel unit, and since a reverse bias capacitance of the at least two photoelectric conversion structures connected in series is less than a reverse bias capacitance of any one of the photoelectric conversion structures, compared with the prior art in which each detector pixel unit is provided with one photoelectric conversion structure and the reverse bias capacitance is reduced by increasing a thickness of the photoelectric conversion device, in the embodiment of the present disclosure, the reverse bias capacitance of the photoelectric conversion device can be greatly reduced without changing the thickness of any photoelectric conversion structure, and an amplitude of reduction of the reverse bias capacitance is much greater than an amplitude of reduction of the reverse bias capacitance achieved by increasing the thickness of the photoelectric conversion device, so that the sensitivity of detection is improved. Moreover, the at least two photoelectric conversion structures connected in series may be disposed in a same plane instead of being stacked up and down, so that the at least two photoelectric conversion structures connected in series all can be irradiated by visible light, except a loss of area caused by forming vias and wiring for connecting the at least two photoelectric conversion structures in series, an overall pixel fill-rate of the detector pixel unit is still kept within an acceptable range.

In some implementations, the substrate base may be a flexible substrate base, with excellent heat resistance and durability, such as a plastic substrate base made of polyvinyl ether phthalate, polyethylene naphthalate glycol ester, polycarbonate, polyarylate, polyetherimide, polyethersulfone, polyimide, or the like, or may be a rigid substrate base, such as a glass substrate base, the present disclosure is not limited thereto.

In some implementations, the bias voltage line may be made of metal, and the metal has a relatively low resistivity, so that the uniformity of a bias voltage in an entire region being detected can be ensured.

It should be noted that, in the embodiment of the present disclosure, the photoelectric conversion device including two photoelectric conversion structures connected in series is taken as an example, but the photoelectric conversion device may include three photoelectric conversion structures connected in series, four photoelectric conversion structures, and the like. For example, if the photoelectric conversion device includes three photoelectric conversion structures connected in series, the bottom electrode of the first photoelectric conversion structure is electrically connected to the driver circuit, the top electrode of the first photoelectric conversion structure is electrically connected to the bottom electrode of the second photoelectric conversion structure, the top electrode of the second photoelectric conversion structure is electrically connected to the bottom electrode of the third photoelectric conversion structure, and the top electrode of the third photoelectric conversion structure is electrically connected to the bias voltage line.

In some implementations, in the detector substrate provided in the embodiment of the present disclosure, as shown in FIGS. 2 and 3, orthographic projections of the photoelectric conversion structures (31 and 32) on the substrate base 1 do not overlap with each other. Therefore, each of the photoelectric conversion structures (31 and 32) can be irradiated by visible light, and can fill the detector pixel unit to the maximum extent, the reverse bias capacitance of the photoelectric conversion device 3 can be ensured to be reduced with the pixel fill-rate being within the acceptable range, and the sensitivity of detection is improved.

In some implementations, in the detector substrate provided in the embodiment of the present disclosure, as shown in FIG. 2, bottom electrodes (311 and 321) of the photoelectric conversion structures (31 and 32) are disposed in a same layer, and top electrodes (312 and 322) of the photoelectric conversion structures (31 and 32) are disposed in a same layer. Therefore, the bottom electrodes (311 and 321)

of the photoelectric conversion structures (31 and 32) are formed simultaneously by forming a bottom electrode film layer, and the top electrodes (312 and 322) of the photoelectric conversion structures (31 and 32) are formed simultaneously by forming a top electrode film layer, the number of masks or processes is not to be increased, and a thickness of the detector substrate is also not to be increased.

In some implementations, in the detector substrate provided in the embodiment of the present disclosure, as shown in FIG. 2, the photoelectric conversion structure (e.g., 31) includes a first photoelectric conversion layer 313 disposed between the top electrode 312 and the bottom electrode 311 thereof, the photoelectric conversion structure (e.g., 32) includes a second photoelectric conversion layer 323 disposed between the top electrode 322 and the bottom electrode 321 thereof, and the first photoelectric conversion layer 313 and the second photoelectric conversion layer 323 are disposed in a same layer. The first photoelectric conversion layer 313 and the second photoelectric conversion layer 323 each convert an optical signal into an electrical signal.

In some implementations, the first photoelectric conversion layer 313 and the second photoelectric conversion layer 323 each may be a PN structure or a PIN structure. Specifically, the PIN structure includes an N-type doped N-type semiconductor layer, an un-doped intrinsic semiconductor layer I and a P-type doped P-type semiconductor layer. A thickness of the intrinsic semiconductor layer I may be greater than a thickness of each of the P-type semiconductor layer and the N-type semiconductor layer.

In some implementations, as shown in FIG. 2, the driver circuit 2 includes a thin film transistor, which may include a gate electrode 21, an active layer 22, a source electrode 23, and a drain electrode 24 on the substrate base 1, and the bottom electrode 311 of the first photoelectric conversion structure (31) is electrically connected to the drain electrode 24. In the embodiment of the present disclosure, the thin film transistor being of a bottom gate structure is taken as an example, but the thin film transistor may alternatively be of a top gate structure. The gate electrode 21, the source electrode 23, and the drain electrode 24 each may be made of molybdenum, aluminum, silver, copper, titanium, platinum, tungsten, tantalum, tantalum nitride, alloys thereof, combinations thereof, or other suitable materials. In addition, functions of the source electrode and the drain electrode of the thin film transistor can be interchanged according to a type of the transistor (P-type or N-type) and an input signal of the transistor, and are not specifically distinguished herein.

In some implementations, the thin film transistor may be an amorphous silicon thin film transistor, an oxide thin film transistor, an LTPS (low temperature poly-silicon) thin film transistor, or the like. If the transistor is an oxide thin film transistor, the transistor may include an active layer formed of a metal oxide, e.g., indium gallium zinc oxide (IGZO), and the active layer includes a channel region and source and drain contact regions. Due to the excellent carrier mobility of the IGZO active layer, the readout rate of detection data can be improved, and a dynamic real-time detection can be realized.

In some implementations, in the detector substrate provided in the embodiment of the present disclosure, as shown in FIG. 2, an orthographic projection of the first photoelectric conversion structure (e.g., 31) on the substrate base 1 may cover an orthographic projection of the driver circuit 2 on the substrate base 1, which can prevent visible light from reaching the active layer of the thin film transistor in the driver circuit 2 and avoid a failure of the thin film transistor.

In some implementations, as shown in FIGS. 2 and 3, the detector substrate provided in the embodiment of the present disclosure further includes a conductive connection part 5 for connecting the photoelectric conversion structures (31 and 32) in series, and the conductive connection part 5 and the bias voltage line 4 are disposed in a same layer. Therefore, patterns of the conductive connection part 5 and the bias voltage line 4 can be formed by a single patterning process by changing the pattern originally to be patterned for forming the bias voltage line 4, no process for independently preparing the conductive connection part 5 is to be added, resulting in a simplified preparation process, a reduced production cost, and an improved production efficiency.

In some implementations, the bottom electrodes (311 and 321) may be formed of molybdenum, aluminum, silver, copper, titanium, platinum, tungsten, tantalum, tantalum nitride, alloys thereof, combinations thereof, or other suitable materials, and the top electrodes (312 and 322) and the conductive connection part 5 may be formed of indium tin oxide (ITO) or indium zinc oxide (IZO) or other suitable transparent materials, so as to improve an efficiency of light transmission.

In some implementations, in the detector substrate provided in the embodiment of the present disclosure, as shown in FIG. 3, a division line L between any two adjacent photoelectric conversion structures (31 and 32) may intersect with the bias voltage line 4. For example, in FIG. 3, the division line L between any two adjacent photoelectric conversion structures (31 and 32) may be parallel to a diagonal line of the detector pixel unit P, that is, an area is divided, along an oblique direction, into areas for the two adjacent photoelectric conversion structures (31 and 32), which can reduce a proportion of a sidewall of each of the photoelectric conversion structures (31 and 32), so as to reduce a defect of sidewalls, thereby reducing a leakage current.

It should be noted that, the division line L being parallel to the diagonal line of the detector pixel unit P means that the division line L is substantially parallel to the diagonal line of the detector pixel unit P. In fact, due to manufacturing processes and other reasons, the division line L may not be completely parallel to the diagonal line of the detection pixel unit P.

In some implementations, as shown in FIG. 3, the division line L may be directed to a side where the driver circuit 2 is disposed, but the present disclosure is not limited thereto.

In some implementations, a division line between any two adjacent photoelectric conversion structures intersects with the bias voltage line, and for example, the division line may be perpendicular to the bias voltage line, as long as the photoelectric conversion structures can be connected in series with each other.

Figure 5:
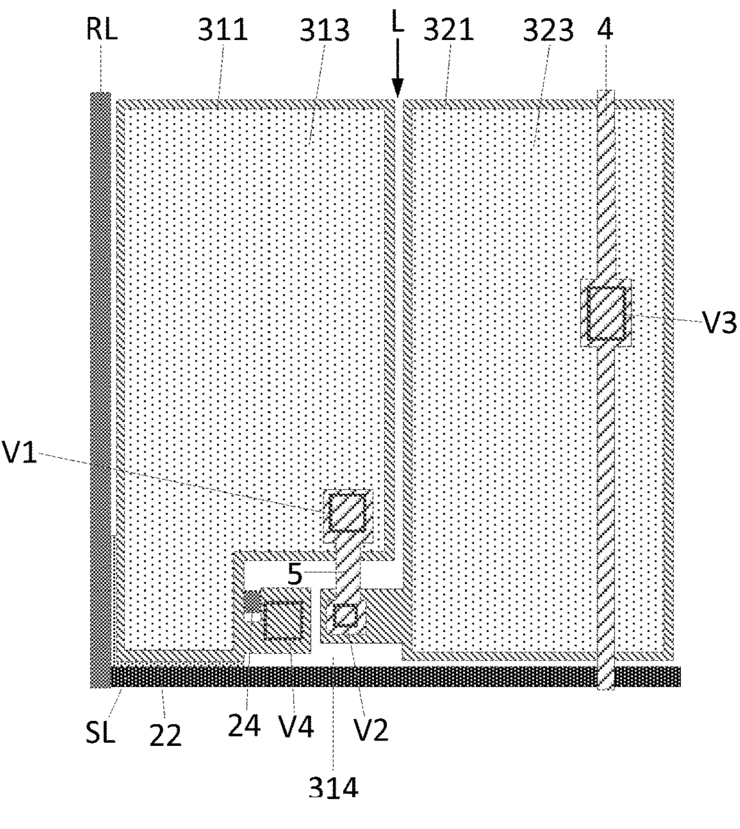
FIG. 5 is a schematic plan view of a detector substrate according to an embodiment of the present disclosure.
Figure 6:
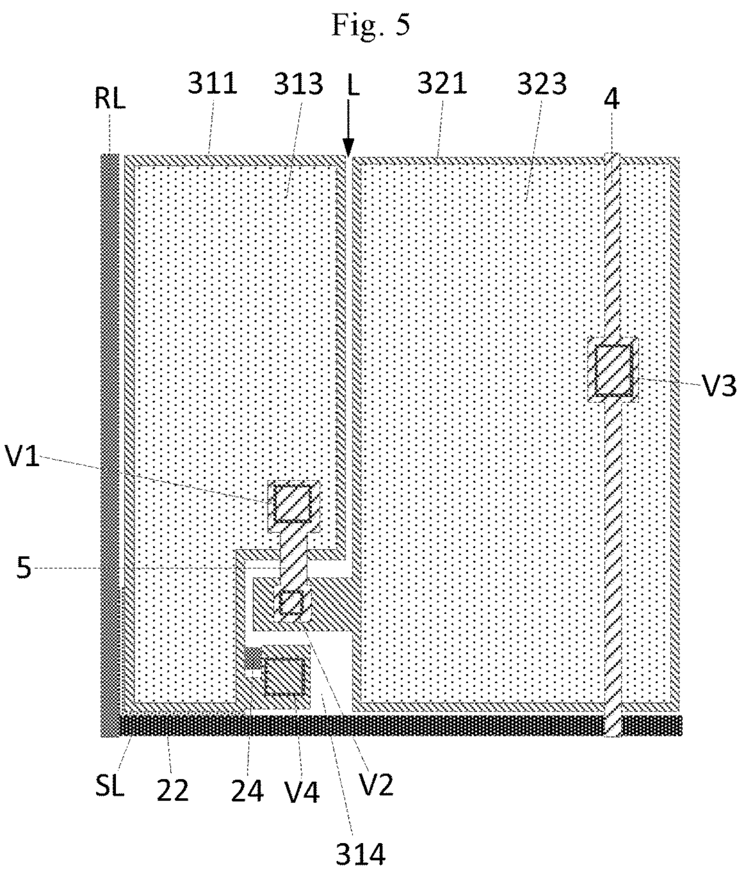
FIG. 6 is a schematic plan view of a detector substrate according to an embodiment of the present disclosure.
Figure 7:
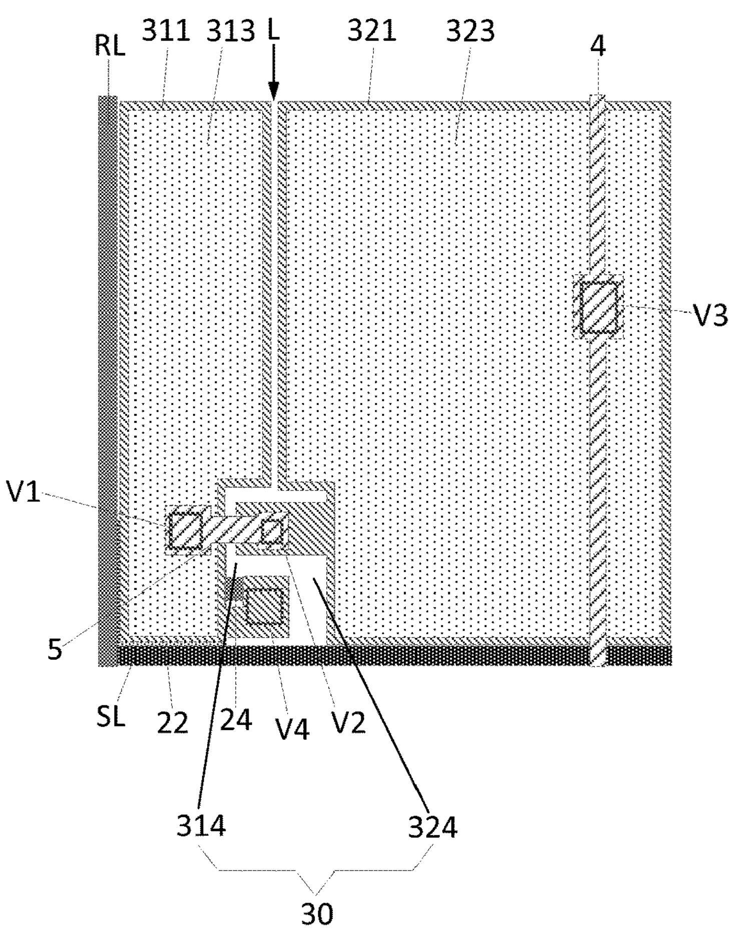
FIG. 7 is a schematic plan view of a detector substrate according to an embodiment of the present disclosure.

In some implementations, in the detector substrate provided in the embodiment of the present disclosure, as shown in FIGS. 5 to 7, the division line L between any two adjacent photoelectric conversion structures (31 and 32) may be parallel to the bias voltage line 4. That is, an area is directly divided, along a vertical direction, into areas for the two adjacent photoelectric conversion structures (31 and 32). In practices, the area may be divided as any of those shown in FIG. 3 and FIGS. 5 to 7 as desired.

It should be noted that the embodiment of the present disclosure only exemplifies several divisions as shown in FIG. 3 and FIGS. 5 to 7, but the present disclosure is not limited thereto, and all divisions enabling the photoelectric conversion structures in the photoelectric conversion device to be connected in series are within the protection scope of the embodiment of the present disclosure.

In some implementations, in the detector substrate provided in the embodiment of the present disclosure, as shown in FIG. 2, the photoelectric conversion device 3 includes the first photoelectric conversion structure 31 and the second photoelectric conversion structure 32 connected in series, the bottom electrode 311 of the first photoelectric conversion structure 31 is electrically connected to the driver circuit 2, the top electrode 312 of the first photoelectric conversion structure 31 is electrically connected to an end of the conductive connection part 5, another end of the conductive connection part 5 is electrically connected to the bottom electrode 321 of the second photoelectric conversion structure 32, and the top electrode 322 of the second photoelectric conversion structure 32 is electrically connected to the bias voltage line 4. The first photoelectric conversion structure 31 and the second photoelectric conversion structure 32 connected in series can achieve a desired reverse bias capacitance, and can achieve a relatively ideal sensitivity at a relatively high rate of reading frames.

In some implementations, in the detector substrate provided in the embodiment of the present disclosure, as shown in FIG. 3 and FIGS. 5 to 7, an area of the first photoelectric conversion structure 31 may be less than or equal to an area of the second photoelectric conversion structure 32. For example, as shown in FIGS. 3 and 5, the area of the first photoelectric conversion structure 31 is approximately equal to the area of the second photoelectric conversion structure 32 (without considering the loss of area caused by vias, and due to the manufacturing process, there may be a certain error, which may result in an incomplete equal), so that the reverse bias capacitance in each detector pixel unit P can be reduced to ¼ of that in the prior art, which is enough to achieve the purpose of raising the frame rate. As shown in FIG. 6, a ratio of the area of the first photoelectric conversion structure 31 to the area of the second photoelectric conversion structure 32 is about 1:2, and the total reverse bias capacitance obtained by connecting the first photoelectric conversion structure 31 and the second photoelectric conversion structure 32 in series is less than the reverse bias capacitance of the first photoelectric conversion structure 31 with the less area, so that the reverse bias capacitance in each detector pixel unit P can be reduced to 2/9 of that in the prior art, and is further reduced. As shown in FIG. 7, a ratio of the area of the first photoelectric conversion structure 31 to the area of the second photoelectric conversion structure 32 is about 1:3, and the total reverse bias capacitance obtained by connecting the first photoelectric conversion structure 31 and the second photoelectric conversion structure 32 in series is less than the reverse bias capacitance of the first photoelectric conversion structure 31 with the less area, so that the reverse bias capacitance in each detector pixel unit P can be reduced to 3/16 of that in the prior art, and is further reduced. Therefore, the ratio of the area of the first photoelectric conversion structure 31 to the area of the second photoelectric conversion structure 32 can be set as desired.

In some implementations, as shown in FIGS. 2 and 3, the detector substrate provided in the embodiment of the present disclosure further includes a first planarization layer 6 between the photoelectric conversion device 3 and the bias voltage line 4, the first planarization layer 6 includes a first part 61 covering the top electrode 312 of the first photoelectric conversion structure 31, a second part 62 covering the top electrode 322 of the second photoelectric conversion structure 32, and a third part 63 filled in a gap between the first photoelectric conversion structure 31 and the second photoelectric conversion structure 32, a first end of the conductive connection part 5 is electrically connected to the top electrode 312 of the first photoelectric conversion structure 31 through a first via V1 penetrating through the first part 61, a second end of the conductive connection part 5 is electrically connected to the bottom electrode 321 of the second photoelectric conversion structure 32 through a second via V2 penetrating through the third part 6, and the bias voltage line 4 is electrically connected to the top electrode 322 of the second photoelectric conversion structure 32 through a third via V3 penetrating through the second part 62.

In some implementations, a material of the first planarization layer 6 may be an organic insulation material such as polyacrylic resin, polyepoxy acrylic resin, photosensitive polyimide resin, polyester acrylate, polyurethane acrylate resin, phenolic epoxy acrylic resin, and the like, the present disclosure is not limited thereto.

In some implementations, as shown in FIG. 2 and FIG. 3, the detector substrate provided in the embodiment of the present disclosure further includes a passivation layer 7 between the driver circuit 2 and the photoelectric conversion device 3, and a second planarization layer 8 between the passivation layer 7 and the photoelectric conversion device 3, the bottom electrode 311 of the first photoelectric conversion structure 31 is electrically connected to the driver circuit 2 through a fourth via V4 penetrating through the second planarization layer 8 and the passivation layer 7.

In some implementations, a material of the passivation layer 7 may be any or any combination of silicon oxide, silicon nitride or silicon oxynitride, a material of the second planarization layer 8 may an organic insulation material such as polyacrylic resin, polyepoxy acrylic resin, photosensitive polyimide resin, polyester acrylate, polyurethane acrylate resin, phenolic epoxy acrylic resin, and the like, the present disclosure is not limited thereto.

In some implementations, as shown in FIG. 2, the detector substrate provided in the embodiment of the present disclosure further includes a gate insulation layer 9 between the gate electrode 21 and the active layer 22. A material of the gate insulation layer 9 may be any or any combination of silicon oxide, silicon nitride, or silicon oxynitride.

In some implementations, in the detector substrate provided in the embodiment of the present disclosure, as shown in FIG. 5 and FIG. 6, the first photoelectric conversion structure 31 may include a first avoidance portion 314, the first avoidance portion 314 is close to the driver circuit 2, and the second via V2 and the fourth via V4 may be disposed in a region where the first avoidance portion 314 is disposed. The region where the first avoidance portion 314 is disposed is provided therein with a part of the bottom electrode 311 of the first photoelectric conversion structure 31 and a part of the bottom electrode 321 of the second photoelectric conversion structure 32, but not provided with the first photoelectric conversion layer 313 and the top electrode 312, and also not provided with the second photoelectric conversion layer 323 and the top electrode 322.

In some implementations, in the detector substrate provided in the embodiment of the present disclosure, as shown in FIG. 3, the second photoelectric conversion structure 32 may include a second avoidance portion 324, the second avoidance portion 324 is close to the driver circuit 2, and the second via V2 and the fourth via V4 may be disposed in a region where the second avoidance portion 324 is disposed. The region where the second avoidance portion 324 is disposed is provided therein with a part of the bottom electrode 311 of the first photoelectric conversion structure 31 and a part of the bottom electrode 321 of the second photoelectric conversion structure 32, but not provided with the first photoelectric conversion layer 313 and the top electrode 312, and also not provided with the second photoelectric conversion layer 323 and the top electrode 322.

In some implementations, in the detector substrate provided in the embodiment of the present disclosure, as shown in FIG. 7, the first photoelectric conversion structure 31 may include a first avoidance portion 314, the second photoelectric conversion structure 32 may include a second avoidance portion 324, the first avoidance portion 314 and the second avoidance portion 324 are adjacent to each other to form an avoidance part 30, and the second via V2 and the fourth via V4 are disposed in a region where the avoidance part 30 is disposed. The region where the avoidance part 30 is disposed is provided therein with a part of the bottom electrode 311 of the first photoelectric conversion structure 31 and a part of the bottom electrode 321 of the second photoelectric conversion structure 32, but not provided with the first photoelectric conversion layer 313 and the top electrode 312, and also not provided with the second photoelectric conversion layer 323 and the top electrode 322.

In some implementations, in the detector substrate provided in the embodiment of the present disclosure, as shown in FIG. 2, FIG. 3, and FIG. 5 to FIG. 7, an orthographic projection of the second via V2 on the substrate base 1 and an orthographic projection of the fourth via V4 on the substrate base 1 do not overlap with each other, which can prevent the conductive connection part 5 from being short-circuited with the bottom electrode 311 of the first photoelectric conversion structure 31.

In some implementations, in the detector substrate provided in the embodiment of the present disclosure, as shown in FIGS. 3, 6, and 7, the second via V2 and the fourth via V4 may be arranged along a direction in which the bias voltage line 4 extends, and as shown in FIG. 5, the second via V2 and the fourth via V4 may be arranged along a direction perpendicular to the direction in which the bias voltage line 4 extends. Specific arrangement positions of the second via V2 and the fourth via V4 may be set according to a structural distribution of the first photoelectric conversion structure 31 and the second photoelectric conversion structure 32 and a size of the avoidance portion/part.

In some implementations, in the detector substrate provided in the embodiment of the present disclosure, as shown in FIGS. 5 and 6, the first via V1 and the second via V2 may be arranged along a direction in which the bias voltage line 4 extends, or as shown in FIGS. 3 and 7, the first via V1 and the second via V2 may be arranged in a direction perpendicular to the direction in which the bias voltage line 4 extends. Specific arrangement positions of the first via V1 and the second via V2 may be set according to the arrangement positions of the second via V2 and the fourth via V4.

In some implementations, in the detector substrate provided in the embodiment of the present disclosure, as shown in FIG. 2, a thickness of each of the first photoelectric conversion layer 313 and the second photoelectric conversion layer 323 may range from about 0.9 μm to about 1.5 μm. This thickness is a thickness of a current mainstream PIN structure, and this range of the thickness can ensure a sufficient absorption of visible light.

Figure 8:
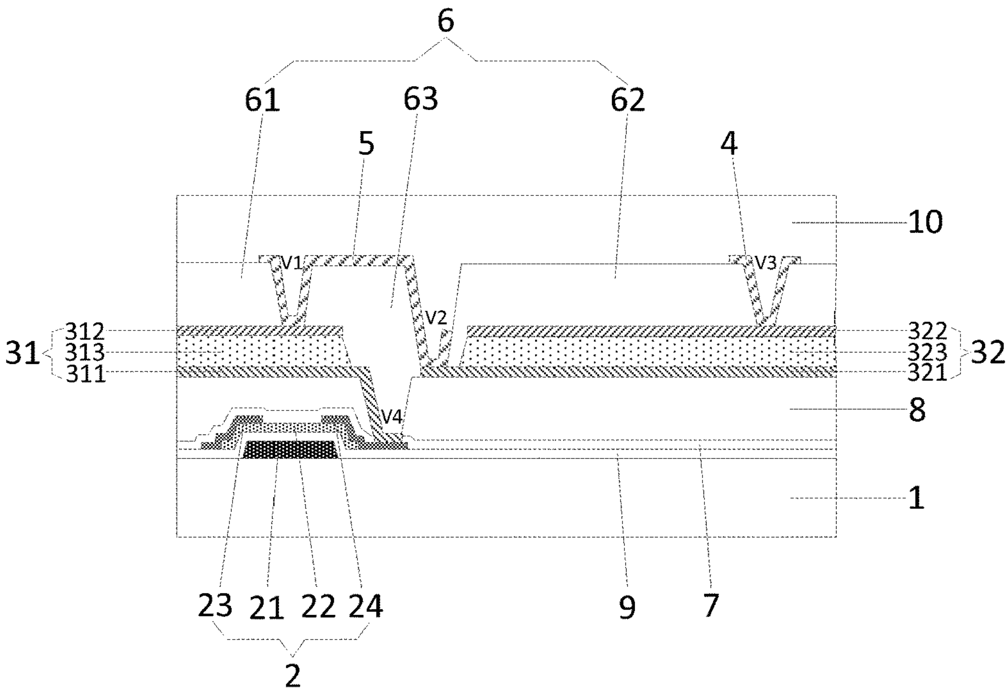
FIG. 8 is a schematic structural diagram of a detector substrate according to an embodiment of the present disclosure.

In some implementations, if the reverse bias capacitance of each detector pixel unit is not desired to be reduced too much, the thickness of the PIN structure may be reduced first as the prior art, and then a compensation is to be performed by connecting photoelectric conversion structures in series, so that, in the detector substrate provided in the embodiment of the present disclosure, as shown in FIG. 8, the thickness of each of the first photoelectric conversion layer 313 and the second photoelectric conversion layer 323 may range from 0.5 μm to 0.7 μm. This range of the thickness still can substantially ensure the sufficient absorption of visible light and can further reduce the risk of the underlying IGZO active layer 22 becoming conductive in a hydrogenation process during the PIN structure being deposited. For example, by taking the thickness of the current mainstream PIN structure being about 1 μm as an example, if the thickness of the PIN structure in any detector pixel unit in the prior art is thinned to about 0.5 μm, the reverse bias capacitance thereof is to be increased by 2 times, and the total reverse bias capacitance can be reduced to ½ or less of that in the prior art by connecting thinned PIN structures in series in a manner provided in the embodiment of the present disclosure.

Figure 9:
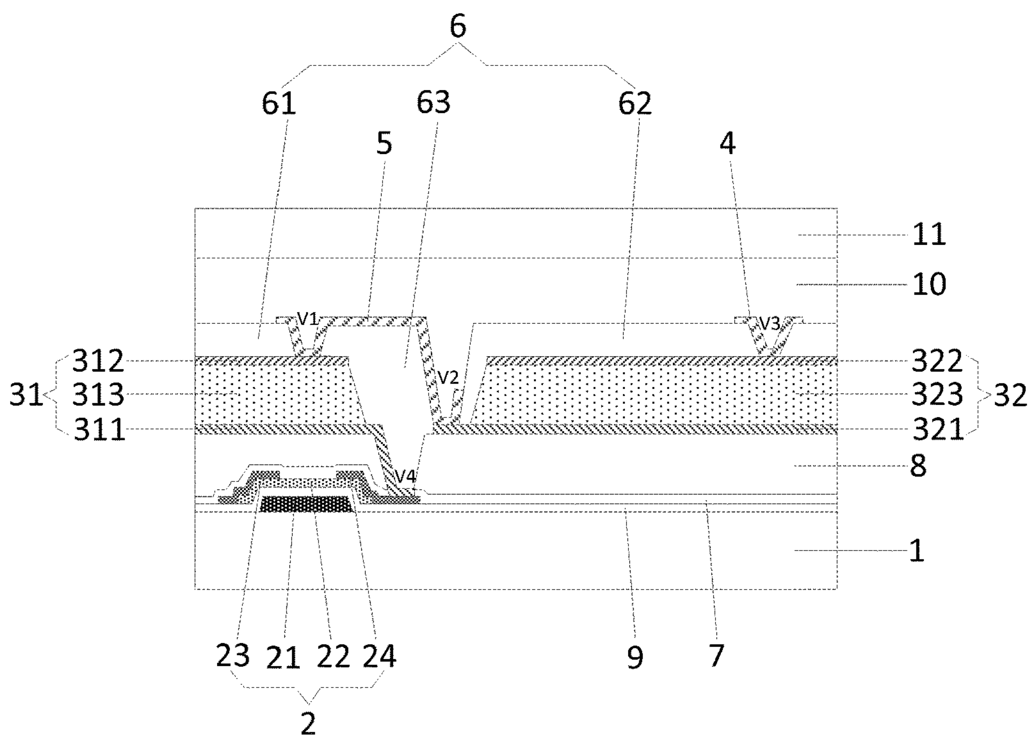
FIG. 9 is a schematic structural diagram of a detector substrate according to an embodiment of the present disclosure.

In some implementations, as shown in FIG. 9, the detector substrate provided in the embodiment of the present disclosure further includes a protective layer 10 on a side of the bias voltage line 4 away from the substrate base 1, and a scintillator layer 11 on a side of the protective layer 10 away from the substrate base 1. Specifically, the protective layer 10 can block external moisture and protect the bias voltage line 4 and the conductive connection part 5, and the protective layer 10 may be formed of silicon oxide, silicon nitride, silicon oxynitride, or other suitable materials.

Specifically, a material of the scintillator layer 11 is a material capable of converting X-rays into visible light, and is mainly composed of a scintillator, which is a kind of material capable of emitting light after absorbing high-energy particles or rays, and is usually processed into a crystal (called a scintillation crystal) in applications, a specific material of the scintillation crystal of the scintillator layer may be cesium iodide (CsI), cadmium tungstate, barium fluoride, gadolinium oxysulfide (GOS), or the like, the embodiment of the present disclosure is not limited thereto.

The process of operating of the detector substrate, shown in FIG. 9, provided in the embodiment of the present disclosure is as follows. The scintillator layer 11, impacted by the high-energy particles of X-rays, converts the kinetic energy of the high-energy particles of the X-rays into light energy to emit a flash light (visible light signal), the photoelectric conversion device 3 converts the light signal into an electrical signal to be read out through the thin film transistor, and an X-ray image is to be obtained by subsequently processing (including amplification, conversion, and the like) the electrical signal.

Based on the same inventive concept, an embodiment of the present disclosure further provides a flat panel detector, which includes the detector substrate provided in the embodiment of the present disclosure. Because the principle of the flat panel detector solving the problem is similar to that of the detector substrate, the implementations of the flat panel detector may be referred to the implementations of the detector substrate, and the repeated description is not to be provided.

Figure 10:
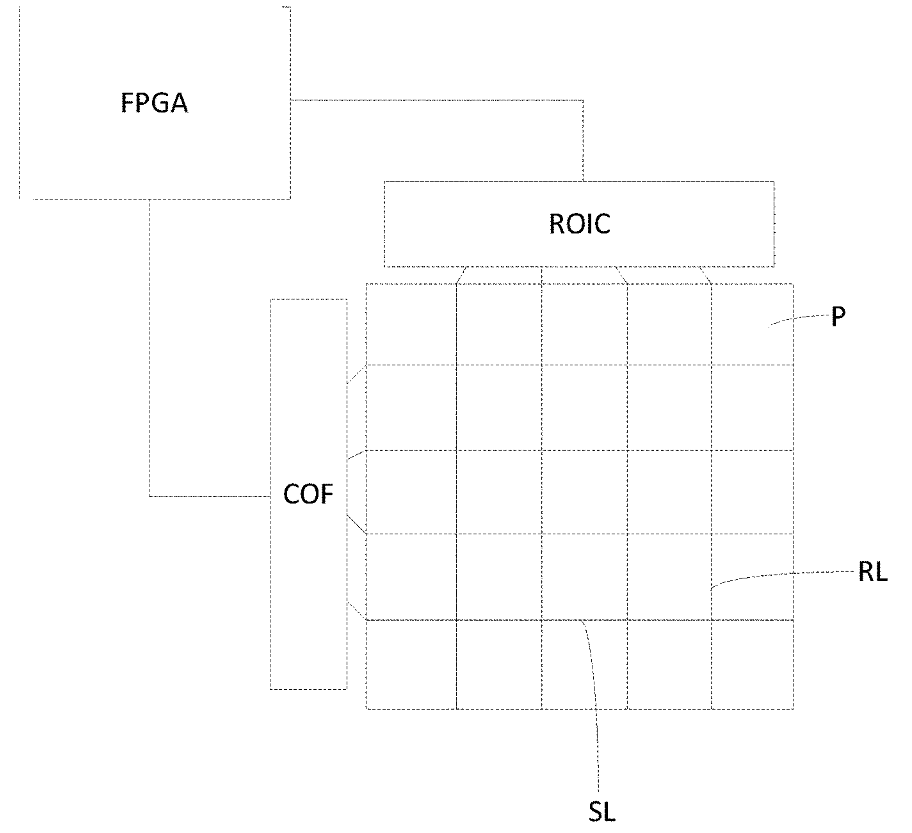
FIG. 10 is a schematic diagram of a flat panel detector according to an embodiment of the present disclosure.

Specifically, FIG. 10 is a schematic diagram of a flat panel detector, and as shown in FIG. 10, scan-signal lines SL intersect with read-signal lines RL to define a plurality of detector pixel units P, each detector pixel unit includes a thin film transistor and a photoelectric conversion device, drain electrodes of thin film transistors in a same column are electrically connected to a same one of the read-signal lines RL, gate electrodes of the thin film transistors in a same row are electrically connected to a same one of the scan-signal lines SL, and a bias voltage line may extend in the same direction as the read-signal lines RL. The flat panel detector further includes an FPGA (field-programmable gate array) chip, the scan-signal lines SL are connected with the FPGA chip through a COF (chip on flex or chip on film, commonly called as chip on film), the COF includes a gate driver IC (integrated chip). The read-signal lines RL are connected to the FPGA chip through a readout IC (ROIC).

The embodiments of the present disclosure provide the detector substrate and the flat panel detector, at least two photoelectric conversion structures which are sequentially connected in series are provided in each detector pixel unit, and since the reverse bias capacitance obtained by connecting the photoelectric conversion structures in series is less than the reverse bias capacitance of any one of the photoelectric conversion structures, compared with the prior art that each detector pixel unit is provided with one photoelectric conversion structure and the reverse bias capacitance is reduced by increasing the thickness of the photoelectric conversion device, the embodiment of the present disclosure can greatly reduce the reverse bias capacitance of the photoelectric conversion device without changing the thickness of each photoelectric conversion structure, and the amplitude of reduction of the reverse bias capacitance is much higher than the amplitude of reduction of the reverse bias capacitance by increasing the thickness of the photoelectric conversion device, so that the sensitivity of detection is improved. Moreover, the at least two photoelectric conversion structures connected in series can be disposed in a same plane instead of being stacked up and down, so that the at least two photoelectric conversion structures connected in series all can be irradiated by visible light, except the loss of area caused by forming vias and wiring for connecting the photoelectric conversion structures in series, and the overall pixel fill-rate of the detector pixel unit is still kept within an acceptable range.

Although exemplary embodiments of the present disclosure have been described, additional variations and modifications to the embodiments may be made by those skilled in the art once they learn of the inventive concept. Therefore, it is intended that the appended claims are interpreted as including the described embodiments and all variations and modifications that fall within the scope of the present disclosure.

It will be apparent to those skilled in the art that various variations and modifications may be made to the embodiments of the present disclosure without departing from the scope of the present disclosure. Thus, if such modifications and variations of the embodiments of the present disclosure are within the scope of the present disclosure defined by the claims and their equivalents, the present disclosure is also intended to encompass such modifications and variations.

The invention claimed is:

1. A detector substrate, comprising a substrate base and a plurality of detector pixel units disposed on the substrate base, wherein each of the detector pixel units comprises:

a driver circuit on the substrate base;

a photoelectric conversion device disposed on a side, away from the substrate base, of the driver circuit, the photoelectric conversion device comprising at least two photoelectric conversion structures sequentially connected in series, a bottom electrode of a first photoelectric conversion structure in the at least two photoelectric conversion structures being electrically connected with the driver circuit, and a top electrode of an $n^{th}$ photoelectric conversion structure in the at least two photoelectric conversion structures being electrically connected with a bottom electrode of an $(n+1)^{th}$ photoelectric conversion structure in the at least two photoelectric conversion structures, with n being greater than or equal to 1; and a bias voltage line on a side of the photoelectric conversion device away from the substrate base, the bias voltage line being electrically connected to a top electrode of a last photoelectric conversion structure in the at least two photoelectric conversion structures.

2. The detector substrate of claim 1, wherein orthographic projections of the photoelectric conversion structures on the substrate base do not overlap each other.

3. The detector substrate of claim 1, wherein bottom electrodes of the photoelectric conversion structures are disposed in a same layer, and top electrodes of the photoelectric conversion structures are disposed in a same layer.

4. The detector substrate of claim 1, wherein an orthographic projection of the first photoelectric conversion structure on the substrate base covers an orthographic projection of the driver circuit on the substrate base.

5. The detector substrate of claim 1, further comprising:

a conductive connection part for connecting the photoelectric conversion structures in series, wherein the conductive connection part is disposed in the same layer as the bias voltage line.

6. The detector substrate of claim 5, wherein a division line between any two adjacent photoelectric conversion structures intersects with the bias voltage line.

7. The detector substrate of claim 6, wherein the division line is parallel to a diagonal line of the detector pixel unit.

8. The detector substrate of claim 6, wherein the division line is perpendicular to the bias voltage line.

9. The detector substrate of claim 5, wherein a division line between any two adjacent photoelectric conversion structures is parallel to the bias voltage line.

10. The detector substrate of claim 5, wherein the photoelectric conversion device comprises a first photoelectric conversion structure and a second photoelectric conversion structure connected in series, a bottom electrode of the first photoelectric conversion structure is electrically connected to the driver circuit, a top electrode of the first photoelectric conversion structure is electrically connected to an end of the conductive connection part, another end of the conductive connection part is electrically connected to a bottom electrode of the second photoelectric conversion structure, and a top electrode of the second photoelectric conversion structure is electrically connected to the bias voltage line.

11. The detector substrate of claim 10, wherein an area of the first photoelectric conversion structure is less than or equal to an area of the second photoelectric conversion structure.

12. The detector substrate of claim 11, further comprising:

a first planarization layer between the photoelectric conversion device and the bias voltage line, wherein the first planarization layer comprises a first part covering the top electrode of the first photoelectric conversion structure, a second part covering the top electrode of the second photoelectric conversion structure, and a third part filled in a gap between the first photoelectric conversion structure and the second photoelectric conversion structure, a first end of the conductive connection part is electrically connected with the top electrode of the first photoelectric conversion structure through a first via penetrating through the first part, and a second end of the conductive connection part is electrically connected with the bottom electrode of the second photoelectric conversion structure through a second via penetrating through the third part, and the bias voltage line is electrically connected to the top electrode of the second photoelectric conversion structure through a third via penetrating through the second part.

13. The detector substrate of claim 12, further comprising:

a passivation layer between the driver circuit and the photoelectric conversion device; and a second planarization layer between the passivation layer and the photoelectric conversion device, wherein the bottom electrode of the first photoelectric conversion structure is electrically connected with the driver circuit through a fourth via penetrating through the second planarization layer and the passivation layer.

14. The detector substrate of claim 13, wherein the first photoelectric conversion structure comprises a first avoidance portion, the first avoidance portion is close to the driver circuit, and the second via and the fourth via are disposed in a region where the first avoidance portion is disposed.

15. The detector substrate of claim 14, wherein an orthographic projection of the second via on the substrate base and an orthographic projection of the fourth via on the substrate base do not overlap with each other.

16. The detector substrate of claim 15, wherein the second via and the fourth via are arranged along a direction in which the bias voltage line extends, or the second via and the fourth via are arranged in a direction perpendicular to the direction in which the bias voltage line extends.

17. The detector substrate of claim 16, wherein the first via and the second via are arranged along the direction in which the bias voltage line extends, or the first via and the second via are arranged in a direction perpendicular to the direction in which the bias voltage line extends.

18. The detector substrate of claim 13, wherein the second photoelectric conversion structure comprises a second avoidance portion, the second avoidance portion is close to the driver circuit, and the second via and the fourth via are disposed in a region where the second avoidance portion is disposed.

19. The detector substrate of claim 13, wherein the first photoelectric conversion structure comprises a first avoidance portion, the second photoelectric conversion structure comprises a second avoidance portion, the first avoidance portion and the second avoidance portion are adjacent to each other to form an avoidance part, the avoidance part is disposed close to the driver circuit, and the second via and the fourth via are disposed in a region where the avoidance part is disposed.

20. A flat panel detector, comprising the detector substrate of claim 1.

* * * * *